United States Patent
Wyse et al.

(10) Patent No.: US 8,963,612 B1
(45) Date of Patent: Feb. 24, 2015

(54) MULTIPLE MODE RF CIRCUIT

(71) Applicants: Russell D. Wyse, Center Point, IA (US); Michael L. Hageman, Mount Vernon, IA (US)

(72) Inventors: Russell D. Wyse, Center Point, IA (US); Michael L. Hageman, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/030,411

(22) Filed: Sep. 18, 2013

(51) Int. Cl.
G06G 7/12 (2006.01)
G06G 7/44 (2006.01)
H03D 7/14 (2006.01)

(52) U.S. Cl.
CPC .................................. *H03D 7/1491* (2013.01)
USPC ............................ 327/359; 327/355; 455/326

(58) Field of Classification Search
USPC ........................... 327/355–361; 455/323, 326
See application file for complete search history.

(56) References Cited

U.S. PATENT DOCUMENTS

| 8,116,717 B2 * | 2/2012 | Kuo et al. ..................... 455/313 |
| 8,660,514 B1 * | 2/2014 | Wyse ............................. 455/326 |
| 2005/0099222 A1 * | 5/2005 | Yang et al. .................... 327/404 |

OTHER PUBLICATIONS

U.S. Appl. No. 13/438,544, filed Apr. 3, 2012 "RF Amplifier".
U.S. Appl. No. 61/789,902, filed Mar. 15, 2013 "RF Amplifier".

* cited by examiner

*Primary Examiner* — Dinh Le
(74) *Attorney, Agent, or Firm* — Angel N. Gerdzhikov; Donna P. Suchy; Daniel M. Barbieri

(57) ABSTRACT

A multi-mode circuit can switch an output section between mixer and amplifier modes, with or without variable gain, to create a variable gain amplifier or a variable gain mixer or route an input signal by adjusting a bias current. An input section is controlled by a bias section and connected to the output section. The output section includes a first base-coupled transistor pair adapted to receive an input signal at emitters of the first base-coupled transistor pair, receive a bias signal at bases of the first base-coupled transistor pair, and provide an output signal at collectors of the first base-coupled transistor pair.

14 Claims, 4 Drawing Sheets

MULTIPLE MODE RF CIRCUIT

BACKGROUND

This invention relates to radio communications, and more specifically to a radio frequency (RF) circuit reconfigurable between an RF mixer with fixed gain, RF mixer with variable gain, an RF amplifier with fixed gain, an RF amplifier with variable gain.

Radio frequency (RF) communications equipment generally employs a combination of mixers, amplifiers and switches to route signals through alternate paths for filtering or processing. Amplifiers are useful to increase the power level of a signal of interest. In RF transmission, RF mixers are used to transpose radio frequencies to a useful signal for transmission and delivery at an intermediate frequency. Conversely, in reception, mixers are used to transpose the RF frequency of a received signal to a relatively low intermediate frequency for processing by downstream electronic circuits.

SUMMARY

A multi-mode circuit is disclosed that can switch an output section between mixer and amplifier modes, with or without variable gain, to create a variable gain amplifier or a variable gain mixer or route an input signal by adjusting a bias current.

The multi-mode circuit includes an input section connected to the output section, which is controlled by a bias section. The output section includes a first base-coupled transistor pair adapted to receive an input signal at emitters of the first base-coupled transistor pair, receive a bias signal at bases of the first base-coupled transistor pair, and provide an output signal at collectors of the first base-coupled transistor pair.

The bias section includes a first current mirror and a second current mirror connected to a buffer. The first current mirror and the second current mirror receive control signals from a digital to analog converter and amplify the control signal to the buffer, which provides the bias signal to the output section for switching the output section between its modes of operation, routing the input signal, and controlling the gain of the output section.

In an embodiment, a single output section can control multiple output sections each having its own bias section for switching between various modes of operation and controlling the gain.

These and other aspects, features, and advantages of the invention will become apparent upon review of the following description taken in connection with the accompanying drawings. The invention, though, is pointed out with particularity by the appended claims.

DESCRIPTION OF ILLUSTRATIVE EMBODIMENTS

Radio frequency (RF) communications equipment generally employs a combination of mixers, amplifiers and switches. Mixers are used for up-converting an intermediate frequency (IF) signal to a high-frequency signal or down-converting a high-frequency signal to an IF signal and may be used in both frequency conversion and frequency synthesis applications. Amplifiers are often used for converting a low-power RF signal to a larger signal or converting a larger signal to a low-power RF signal, the latter also being referred to as an attenuator. Switches are used to route signals through alternate paths for filtering or processing.

Amplifiers and mixers are constructed with a combination of discrete components, including transistors. Transistors can be made using various fabrication technologies, such as silicon (SI) substrate, silicon-germanium (Si—Ge) substrate, gallium-arsenide (GaAs) substrate, or gallium-nitride (GaN) on a silicon substrate. Various types of transistors are available, including but not limited to a bipolar terminal transistor (BJT), metallic oxide semiconductor (MOS), complementary metallic oxide semiconductor (CMOS), a bipolar CMOS (Bi-CMOS), heterojunction bipolar transistor (HBT), metal semiconductor field effect transistor (MES-FET) and high electron mobility transistor (HEMT). The described embodiment of the present invention is implemented as an HBT-based integrated circuit (IC); however, any of the foregoing fabrication technologies or transistor types can be employed, as can others.

Figure 2A:
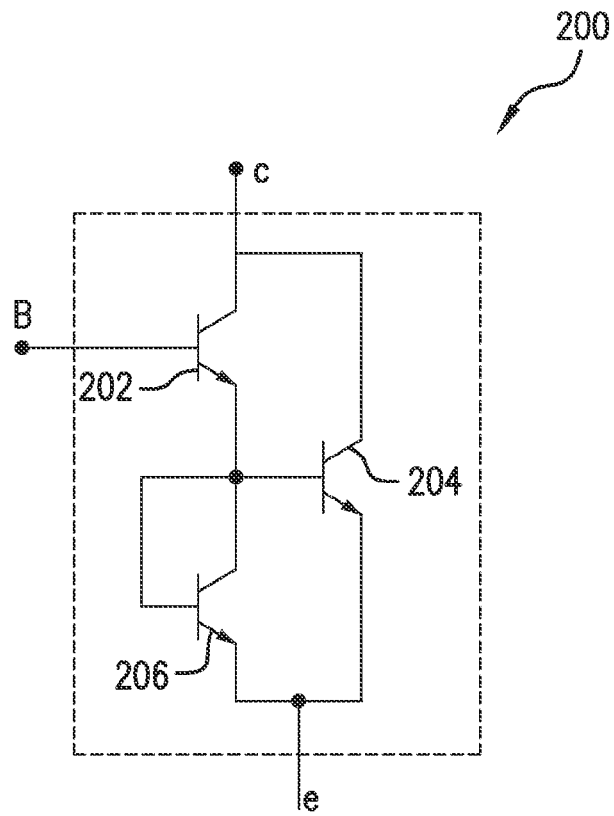
FIG. 2A is a schematic diagram of a Ft doubler suitable for an embodiment of the present invention.
Figure 2B:
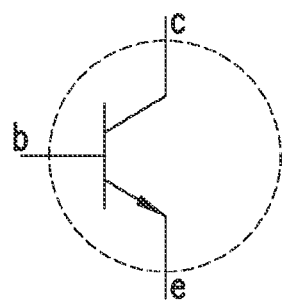
FIG. 2B is a symbol for a bipolar junction transistor found in the multi-mode circuit of FIG. 1 and the Ft doubler of FIG. 2A.

FIG. 2B shows a bipolar typical transistor with a collector "c", a base "b", and an emitter "e" that can be used in an embodiment of the present disclosure.

Figure 1A:
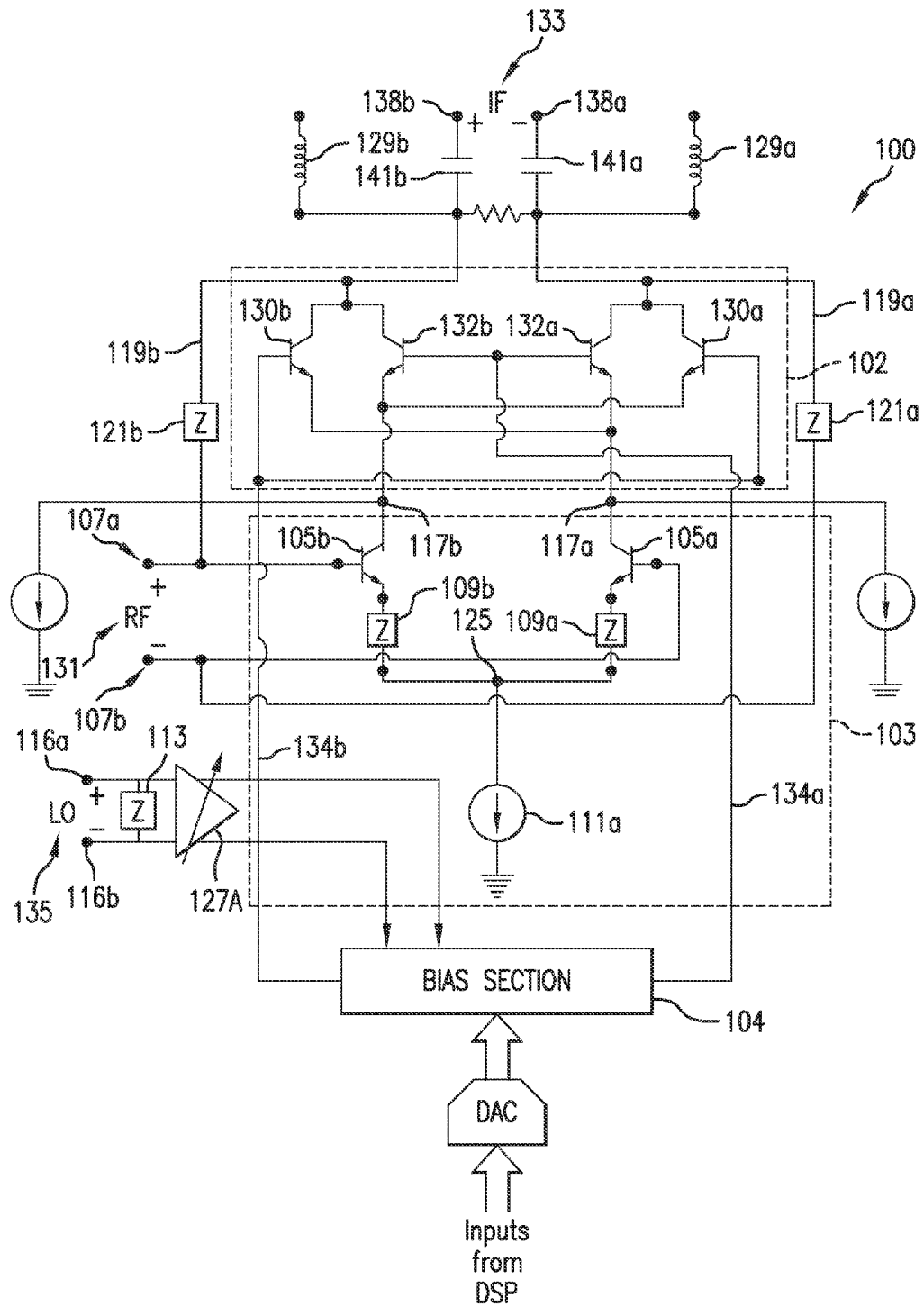
FIG. 1A is a schematic diagram of a multi-mode circuit in accordance with the present invention.

FIG. 1A shows a multiple mode ("multi-mode") circuit 100 according to an embodiment of the present disclosure comprising bipolar transistor technology. Multi-mode circuit 100 includes an input section 103 connected to an output section 102, which is controlled by a bias section 104 that can, depending upon its programming, switch output section 102 between mixer-mode and amplifier-mode, with or without variable gain to create a variable gain amplifier in a variable gain amplifier-mode or a variable gain mixer in a variable gain mixer-mode, and across a wide range of bias and linearity by adjusting a bias current from current source 111a. Bias section 104 can be connected to output section 102 for providing a bias signal to output section 10 for switching output section 102 between an amplifier-mode, a variable gain amplifier-mode, a mixer-mode, a variable gain mixer-mode, and off for switchable routing of the input signal. The circuits shown in FIGS. 1-3 can remain in the same configuration with respect to each mode of operation. Output section 102 can be changed between each mode of operation by varying bias signals to two base-coupled transistor pairs 130a,b and 132a,b of output section 102 and turning on and off a local oscillator (LO) signal 135. Because the modes of operation are changed by varying bias signals, multi-mode circuit 100 can be reconfigured between each mode of operation without the need for physical or logical switches, although such switches can be used, or without other physical changes to the circuits.

Two-stage amplification of an input signal 131 to input section 103 is provided by cascode-coupling input section 103 and output section 102. Input section 103 includes two transistors 105a,b configured as a differential transistor pair. The two transistors 105a,b receive an input signal 131, which is a differential RF input signal 131, from differential input ports 107a,b connected respectively to the bases of transistors 105a,b. The two transistors 105a,b provide a first stage output signal at the collectors, which are connected respectively to nodes 117a,b. The emitters of differential transistor pair 105a,b are coupled to a common node 125 through respective impedances 109a,b, which is connected to current source 111a.

The second stage of amplification of input signal 131, the output stage, receives the first stage output signal at nodes 117a,b and provides a second stage output signal 133 at output ports 138a,b of output section 102. Output section 102 includes four transistors 130a,b and 132a,b with the bases of each pair AC and DC coupled to bias section 104. Output section 102 is DC coupled to a DC source through chokes 129a,b and output signal passes through DC blocking capacitors 141a,b. Cascode-coupling of two amplification stages provides a wide bandwidth, high gain, and better controlled input impedance.

A negative feedback loop is provided between output ports 138a,b of output section 102 and the input ports 107a,b of input section 103. Each of the two negative feedback paths 119a,b provides an RF feedback signal from output ports 138a,b to differential input ports 107a,b, respectively, through a corresponding impedance 121a,b. Current source 111a of input section 103 sets the linearity control and maximum current available to the two transistors 105a,b. A single input section 103 can drive multiple output sections 102a-n, which will be discussed in more detail with FIG. 3. Additional current sources 111b,c connected to nodes 117a,b, respectively, can be used to increase the amount of bias current available to one or more output sections 102a-n.

Figure 1B:
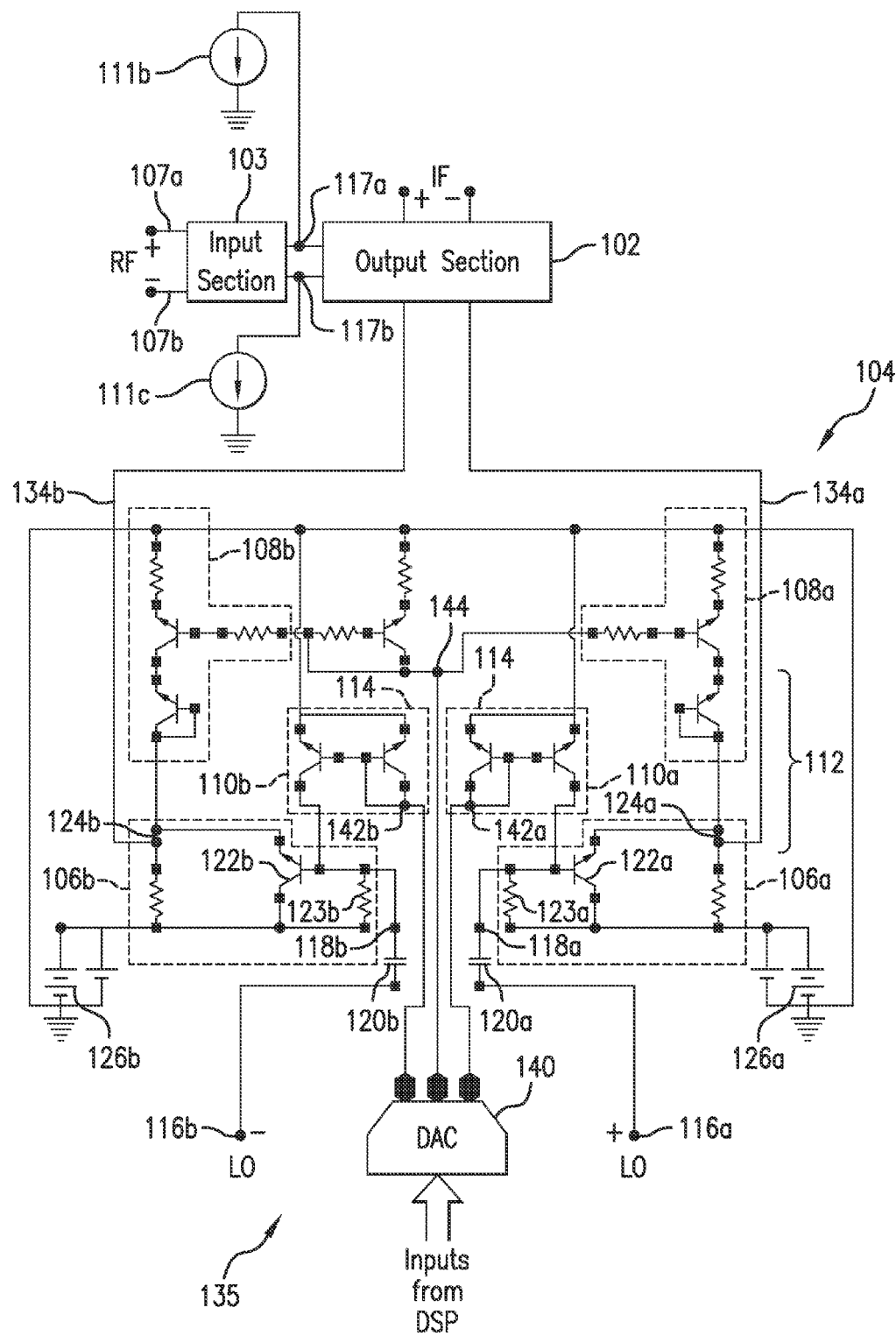
FIG. 1B is a schematic diagram of the bias section of the multi-mode circuit of FIG. 1A.

FIG. 1B shows bias section 104, which generally includes a pair of buffers 106a,b, a pair of first current mirrors 110a,b, and a pair of second current mirrors 108a,b. Each buffer 106a,b, second current mirror 108a,b, and first current mirror 110a,b of the respective pair operate in a similar manner and correspond with each polarity of a differential LO signal 135 at differential bias section input ports 116a,b. More broadly, bias section 104 comprises a first tuner 112, which includes buffers 106 and second current mirrors 108, and a second tuner 114, which includes first current mirrors 110. Current mirrors 108 and 110 receive a control signal from a digital to analog controller (DAC) 140 and mirror and amplify the control signal to the other side of the circuit to isolate DAC 140 from bias section 104; for example, the analog control signal from DAC 140 can range from 0-25 micro-amps and current mirrors 108 and 110 can step up the control signal to a higher range, such as 0-25 mA, 0-80 mA, 0-2 mA, etc.

Buffers 106a,b are connected to the differential bias section input ports 116a,b through corresponding capacitors 120a,b at nodes 118a,b, respectively. Capacitors 120a,b block any direct current (DC) from bias section from 103 leaking into the source of LO signal 135. Buffers 106a,b include common collector transistors 122a,b with the bases connected respectively to nodes 118a,b and the emitters connected respectively to nodes 124a,b. A resistor 123a,b, in each buffer 106a,b, respectively, provides a voltage drop between the bases of transistors 122a,b, respectively, and a voltage source 126a,b connected to each buffer 106a,b, respectively. Nodes 124a,b of buffers 106a,b are connected to the bases of transistor pairs 130a,b and 132a,b of output section 102 by paths 134a,b, respectively. Paths 134a,b carry the DC bias signal from buffers 106a,b, respectively, for controlling the current in output section 102, as well as provide a path for the LO signal 135.

The output of buffers 106a,b provide a bias signal on paths 134a,b, respectively, to output section 102 to switch output section 102 between its various modes of operation and gain settings. The output of buffers 106a,b can also be used to control multiple output sections 102a-n (shown in FIG. 3). FIG. 1A shows output section 102. Transistors 130a,b and 132a,b of output section 102 are connected as two base-coupled transistor pairs 130a,b and 132a,b. Nodes 124a,b of buffers 106a,b are connected to respective base-coupled transistor pairs 130a,b and 132a,b by paths 134a,b, respectively. This enables buffers 106a,b to set the voltage on each of the bases of base-coupled transistor pairs 130a,b and 132a,b. Because the base-coupled transistor pairs 130a,b and 132a,b have their respective bases coupled, the voltage on base of transistor 130a will equal the voltage on the base of transistor 130b, and the voltage on the base of transistor 132a will equal the voltage on the base of transistor 132b.

The voltages on the bases of base-coupled transistor pairs 130a,b, however, can change relative to the voltages on the bases of base-coupled transistor pairs 132a,b to direct the bias current from current sources 111a,b,c between two base-coupled transistor pairs 130a,b and 132a,b. In effect, bias section 104 is steering the bias current from current source 111a,b,c between two base-coupled transistor pairs 130a,b and 132a,b of output sections 102a-n to control the gain by controlling the in-phase transconductance with respect to the out-of-phase transconductance of the two base-coupled transistor pairs 130a,b and 132a,b to increase or decrease the signal cancellation at output ports 138a,b of output section 102.

Figure 3:
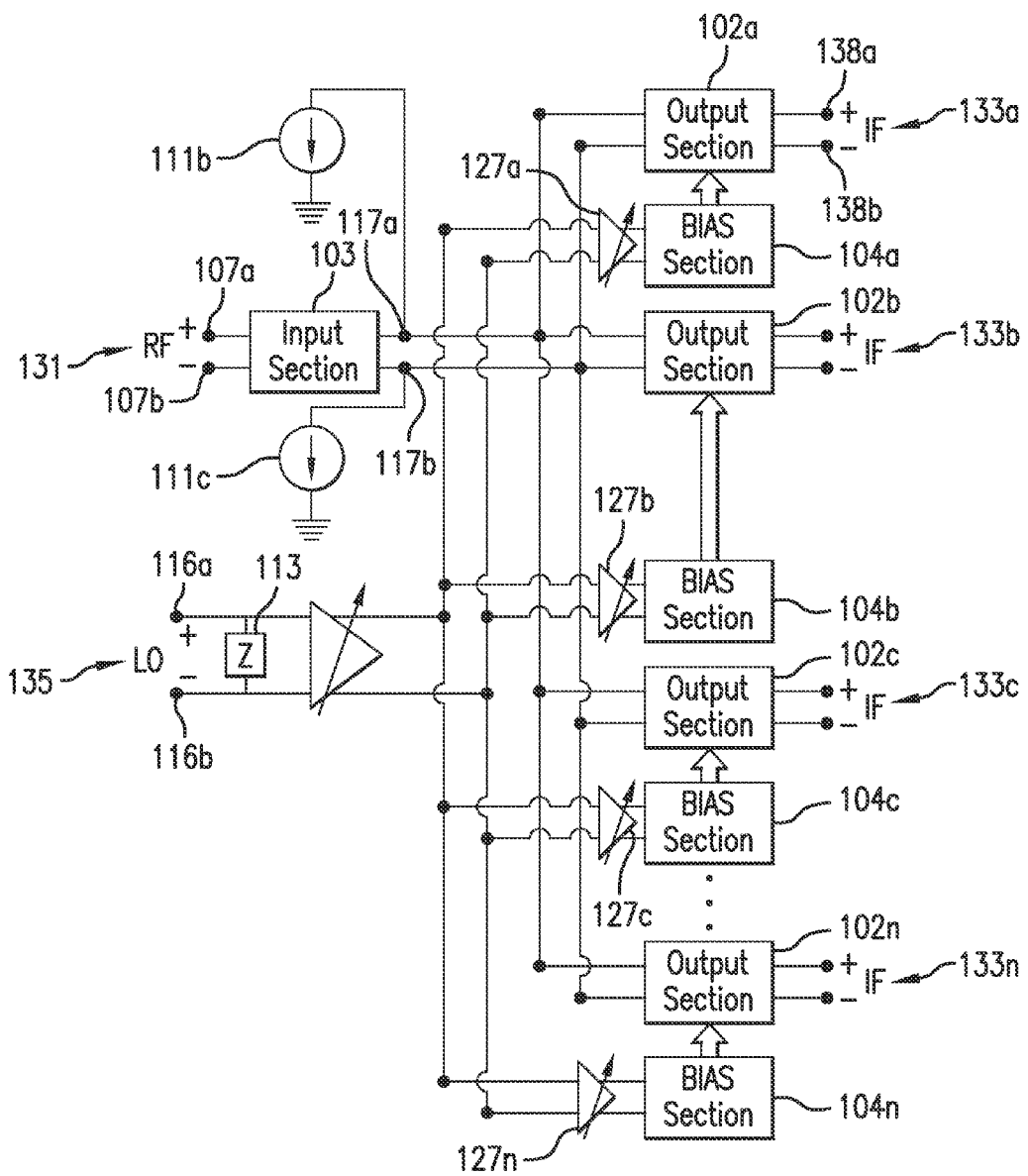
FIG. 3 is a schematic diagram of a single input section from FIG. 1 driving multiple multi-mode circuits.

Output section 102 is switched between mixer-mode and amplifier-mode by modifying the bias voltage in common collector transistors 122a,b in buffers 106a,b and applying an LO signal 135 at input ports 116a,b. As shown in FIG. 3, variable gain amplifier (VGA) buffers 127a-n can be combined between input ports 116a,b and each bias sections 104a-n, respectively, to subdivide LO signal 135 among one or a plurality of bias sections 104a-n for independent control of the LO energy to each bias section 104a-n. When common collector transistors 122a,b are biased on, buffers 106a,b are AC coupled with LO signal 135 through bases of base-coupled transistor pairs 130a,b and 132a,b, respectively. The alternating current of LO signal 135 causes base-coupled transistor pairs 130a,b and 132a,b to switch on and off, which mixes LO signal 135 with input signal 131 received at input section 103 to provide a mixed second stage output signal 133 at output ports 138a,b of output section 102.

Bias section 104 can also modify the gain of output section 102 in mixer and amplifier modes. Second tuner 114 can precisely control the DC voltage levels at nodes 124a,b, of buffers 106a,b, respectively, and maintain a voltage drop across resistors 123a,b, respectively, for precise control over the transconductance of output section 102. First current mirrors 110a,b of second tuner 114 adjust independently the DC voltage at the emitters of common collector transistors 122a,b of buffers 106a,b. This sets the transconductance of first base-coupled transistor pair 130a,b relative to the second transconductance of base-coupled transistor pair 132a,b by regulating the amount of bias current from current sources 111a,b,c that flows through base-coupled transistor pairs 130a,b and 132a,b. For example, if node 124a of buffer 106a is set 0.1V DC higher than node 124b of buffer 106b by using first current mirrors 110 to adjust the DC voltage at the bases of common collector transistors 122a,b of buffers 106a,b, then the voltage on the bases of first base-coupled transistor pair 132a,b will be higher than the voltage on the bases of base-coupled transistor pair 130a,b. The transconductance of first base-coupled transistor pair 132a,b will be higher than the transconductance of the second base-coupled transistor pair 130a,b. The gain is linearly adjusted up and down by raising and lowering the transconductance of base-coupled transistors pairs 130a,b and 132a,b with respect to each other.

In mixer mode, output section 102 operates with the maximum amount of gain when the transconductance of base-coupled transistor pairs 130a,b and 132a,b are equal. Conversely, in amplifier mode, output section 102 operates with the maximum amount of gain when of one of base-coupled transistor pairs 130a,b and 132a,b is receiving all of the bias current from bias source 111a and the other one of base-coupled transistor pairs 130a,b and 132a,b is off.

DAC 140 converts command signals received from a digital signal processor (DSP) to analog signals. These analog signals are used to adjust the outputs of first current mirrors 110 and second current mirrors 108. First current mirrors 110a, b receive an analog input or bias signal from DAC 14 at ports 142,a,b, respectively. The bias signal to each of first current mirrors 110a,b can be varied relative to each other to adjust the DC voltage at the emitters of common collector transistors 122a,b of buffers 106a,b with respect to each other, as discussed above.

DAC 140 also provides a common analog input or bias signal to second current mirrors 108 at port 144. Second current mirrors 108 are used to control which output section 102 is on or off by setting the DC voltage level of buffers 106, as well as the transconductance, transition frequency (ft) and other RF characteristics of output section 102. When biasing output section 102 off, bias current from current source 111a is turned off. DAC 140 can also increase signal and frequency handling capabilities of common collector transistors 122a,b to properly drive LO signal 135 across a wide frequency and signal level range by increasing the bias signal to second current mirrors 108. To conserve power, DAC 140 can lower the bias signal to second current mirrors 108 when output section 102 is not in mixer mode, but still provide enough DC current capability to supply the bias signal to output section 102.

Output section 102 is in mixer-mode when buffers 106 are biased on with sufficient bias current to raise the transconductance and ft enough to move base-coupled transistor pairs 130a,b and 132a,b to a point within their operating range so that the output current of base-coupled transistor pairs 130a,b and 132a,b can increase and decrease (or turn on and off) without distortion as the input signal (LO signal 135) to base-coupled transistor pairs 130a,b and 132a,b swings through a complete AC cycle, and when output section 102 is AC coupled to LO signal 135. VGA buffers 127a,b can be turned on or off to couple or isolate LO signal 135 to the respective bias section 104a-n. In mixer-mode, output section 102 operates at full gain when the voltages at the bases of base-coupled transistor pairs 130a,b 132a,b are balanced or equal. Output section 102 operates at minimum gain when base-coupled transistor pair 132a,b receives a maximum bias voltage and base-coupled transistor pair 130a,b receives no bias voltage, or vice versa provided impedances 121a,b are high enough to prevent positive feedback. Varying the bias voltages with respect to each base-coupled transistor pair 130a,b and 132a,b can modify the gain of output section to any range between maximum and substantially complete signal isolation.

Conversely, in amplifier-mode, output section 102 operates at full gain when second base-coupled transistor pair 132a,b receives a maximum bias voltage and first base-coupled transistor pair 130a,b receives no bias voltage, or vice versa provided impedances 121a,b are high enough to prevent positive feedback. Output section 102 operates at minimum gain (or substantially complete signal isolation) when the voltages at the bases of base-coupled transistor pairs 130a,b 132a,b are balanced or equal. Varying the bias voltages with respect to each base-coupled transistor pair 130a,b and 132a,b can modify the gain of output section to any range between maximum gain and substantially complete signal isolation.

Input section 103 can drive a plurality of output sections 102a-n independently of each other to create an active multi-mode/multi-throw switch. FIG. 3 shows input section 103 connected to multiple output sections 102a-n. Nodes 117a,b, which provide the first stage output signal from input section 103, are connected to each output section 102a-n and are connected to current sources 111b,c, respectively, to boost the bias current when driving multiple output sections 102a-n. This allows a single broadband input signal 131 received at input ports 107a,b to be split for multiple different modifications. For example, output section 102a can function as a mixer, output section 102b can function as an amplifier, output section 102c can function as another mixer, and output section 102d could be off or isolated and receive substantially no RF energy.

Current from current sources 111a,b,c to input section 103 (shown in FIG. 1A) can be steered and subdivided in any manner among a plurality of output sections 102a-n. The analog signal from DAC 140 to second current mirrors 108 at port 144 (shown in FIG. 1B) and first current mirrors 110 at ports 142 set the DC voltage level of buffers 106 in each bias section 104a-n, which sets the voltages on the bases of base-coupled transistor pairs 130a,b and 132a,b of each output section 102a-n in the manner discussed above. The relative DC voltage level between the bases of the base-coupled transistor pairs 130a,b and 132a,b in output sections 102a-n steers the current among the output sections 102a-n. For example, increasing the DC voltage level at the bases of base-coupled transistor pairs 130a,b and 132a,b in output section 102a relative to the other output sections 102b-n, increases the amount of current from current source 111a,b,c that output section 102a consumes. This means that in addition to steering the current between two base-coupled transistor pairs 130a,b and 132a,b in any given output section 102a-n, the current can be steered among output sections 102a-n.

FIG. 3 also shows LO signal 135 provided at input ports 116a,b. VGA buffers 127a-n independently drive bias sections 104a-n, respectively, by supplying or isolating LO signal 135. The high input impedance of VGA buffers 127a-n allows impedance 113 to set the impedance (Z) at input ports 116a,b, the LO input port This enables any given output section 102a-n to be turned off or switched to any mode and gain setting without impacting the input impedance at input ports 116a,b, and also isolate LO signal 135 from output sections 102a-n that do not need any LO energy.

The frequency bandwidth of input section 103 and output sections 102a-n can be nearly doubled by replacing each transistor in base-coupled transistor pairs 130a,b, 132a,b, and 105a,b with an Ft doubler 200, shown in FIG. 2A. Ft doubler 200 includes a transistor 202 Darlington-connected with a transistor 204. A transistor 206 is diode-connected in parallel between the base and the emitter of transistor 204. Ft doubler 200 can be treated as a single transistor unit super-cell with a base, collector, and emitter like the transistor shown in FIG. 2B. Ft doubler 200 nearly doubles the unity-gain frequency of a given transistor topology and raise the impedance at the base of transistor 202, which extends the useable frequency of operation and the level of power saturation where acceptable input impedance is maintained for high-frequency operation, and significantly increases the maximum RF gain per stage for a given transistor technology. More information about the operation of the Ft doublers can be found in U.S. patent application Ser. No. 13/438,544 filed Apr. 3, 2012 and U.S. Pat. App. No. 61/789,902 filed Mar. 15, 2013, the contents of which are hereby incorporated by reference herein.

The devices of the present disclosure can be implemented as a single electrical circuit or unit cell that is reconfigurable to an amplifier or a mixer, with variable gain and variable linearity control and switchable routing of an RF signal. The small size of the device enables integration of other complex RF components, such as phase shifters, true-time delay elements, filters, mixers, etc. to be included on the same die, so that the signal does not have to move on and off the die for modification, thereby minimizing signal losses. Moreover, the instant disclosure teaches a device with more than 30 GHz instantaneous bandwidth.

While the present invention has been particularly shown and described with reference to exemplary embodiments thereof, it should be understood by those of ordinary skill in the art that various changes, substitutions and alterations can be made herein without departing from the scope of the invention as defined by the appended claims and their equivalents.

What is claimed is:

1. A multi-mode circuit comprising:
an output section for modifying an input signal and providing an output signal;
a bias section connected to the output section for providing a bias signal to the output section for switching the output section between an amplifier-mode, a variable gain amplifier-mode, and a mixer-mode; and
a first tuner that directs the bias signal to the output section to switch the output section between the mixer-mode and the amplifier mode,
wherein the first tuner further comprises a buffer connected to a first current mirror, wherein the buffer provides the bias signal to the output section based on a control signal received by the first current mirror.

2. A multi-mode circuit comprising:
an output section for modifying an input signal and providing an output signal;
a bias section connected to the output section for providing a bias signal to the output section for switching the output section between an amplifier-mode, a variable gain amplifier-mode, and a mixer-mode; and
a first tuner that directs the bias signal to the output section to switch the output section between the mixer-mode and the amplifier mode, wherein the bias section further comprises a current source and a second tuner, wherein the second tuner receives a control signal and modifies a gain of the output section with a current from the current source in response to the control signal.

3. The multi-mode circuit of claim 2, wherein the second tuner further comprises a first current mirror that adjusts a voltage of the first tuner to modify the gain of the output section.

4. The multi-mode circuit of claim 3, wherein the output section further comprises a first base-coupled transistor pair adapted to receive the input signal at emitters of the first base-coupled transistor pair, receive the bias signal at bases of the first base-coupled transistor pair, and provide the output signal at collectors of the first base-coupled transistor pair, wherein the first tuner directs the bias signal between the first base-coupled transistor pair to modify a transconductance of the bases of the first base-coupled transistor pair.

5. The multi-mode circuit of claim 4, wherein the output section further comprises a second base-coupled transistor pair that is adapted to receive the input signal at emitters of the second base-coupled transistor pair, receive the bias signal at bases of the second base-coupled transistor pair, and provide the output signal at collectors of the second base-coupled transistor pair.

6. A multi-mode circuit comprising:
a plurality of output sections for modifying an input signal and providing an output signal; and
a corresponding plurality of bias sections each being connected to one of the plurality of output sections for providing a bias signal to each of the plurality of output sections for switching the plurality of output sections between any combination chosen from an amplifier-mode, a variable gain amplifier-mode, a mixer-mode, a variable gain mixer-mode and off to enable routing of the input signal, wherein the plurality of output sections are connected to a single input section, wherein the bias section of each of the plurality of output sections is adapted for switching each of the plurality of output sections between.

7. A multi-mode circuit comprising:
an input section for receiving an input signal and providing a first stage output signal;
at least one output section for receiving the first stage output signal and providing a second stage output signal;
a bias section connected to each output section for providing a bias signal to each output section for switching each output section between an amplifier-mode, a variable gain amplifier-mode, and a mixer-mode; and
a first tuner to switch the output section between the mixer-mode and the amplifier mode, wherein the first tuner further comprises a buffer connected to a second current mirror, wherein the buffer provides the bias signal to the output section based on a control signal received by the second current mirror.

8. A multi-mode circuit comprising:
an input section for receiving an input signal and providing a first stage output signal;
at least one output section for receiving the first stage output signal and providing a second stage output signal;
a bias section connected to each output section for providing a bias signal to each output section for switching each output section between an amplifier-mode, a variable gain amplifier-mode, and a mixer-mode; and
a first tuner to switch the output section between the mixer-mode and the amplifier mode, wherein the bias section further comprises a second tuner that receives a control signal and modifies a gain of the output section in response to the control signal.

9. The multi-mode circuit of claim 8, wherein the second tuner cooperates with the first tuner to modify the gain of the output section with the bias signal.

10. A multi-mode circuit comprising:
an input section for receiving an input signal and providing a first stage output signal;
at least one output section for receiving the first stage output signal and providing a second stage output signal; and
a bias section connected to each output section for providing a bias signal to each output section for switching each output section between an amplifier-mode and a variable gain amplifier-mode, wherein the output section further comprises a first base-coupled transistor pair that is adapted to receive the first stage output signal at emitters of the first base-coupled transistor pair, receive the bias signal at bases of the first base-coupled transistor pair, and provide the second stage output signal at collectors of the first base-coupled transistor pair.

11. The multi-mode circuit of claim 10, wherein the output section further comprises a second base-coupled transistor pair that is adapted to receive the first stage output signal at emitters of the second base-coupled transistor pair, to receive the bias signal at bases of the second base-coupled transistor pair, and provide the second stage output signal at collectors of the second base-coupled transistor pair.

12. A multi-mode circuit comprising:
an input section for receiving an input signal and providing a first stage output signal;
a plurality of output sections connected to the input section for receiving the first stage output signal and providing a second stage output signal; and
a bias section connected to each output section for providing a bias signal to each output section for switching each output section between any combination chosen from an amplifier-mode, a variable gain amplifier-mode, a mixer-mode, a variable gain mixer-mode and off, wherein the bias section of each of the plurality of output sections is adapted for switching each of the plurality of output sections.

13. A multi-mode circuit comprising:
an output section for modifying an input signal and providing an output signal, wherein the output section includes a first base-coupled transistor pair adapted to receive the input signal at emitters of the first base-coupled transistor pair, receive a bias signal at bases of the first base-coupled transistor pair, and provide the output signal at collectors of the first base-coupled transistor pair; and
a bias section connected to the output section for providing the bias signal to the output section for switching the output section between an amplifier-mode, a variable gain amplifier-mode, a mixer-mode, a variable gain mixer-mode, and off for switchable routing of the input signal, wherein the bias section includes a buffer, a first current mirror, and a second current mirror, wherein the buffer provides the bias signal to the output section based on a control signal received by the second current mirror, and wherein the buffer modifies a gain of the output section in response to the control signal.

14. The multi-mode circuit of claim 13, and further comprising a plurality of output sections each having a bias section, wherein the plurality of output sections are connected to a single input section, wherein the bias section of each of the plurality of output sections is adapted for switching each of the plurality of output sections between any combination chosen from an amplifier-mode, a variable gain amplifier-mode, a mixer-mode, a variable gain mixer-mode and off.

* * * * *